(12) United States Patent
Mayer et al.

(10) Patent No.: US 8,597,461 B2
(45) Date of Patent: Dec. 3, 2013

(54) REDUCED ISOTROPIC ETCHANT MATERIAL CONSUMPTION AND WASTE GENERATION

(75) Inventors: Steven T. Mayer, Lake Oswego, OR (US); David W. Porter, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 436 days.

(21) Appl. No.: 12/871,662

(22) Filed: Aug. 30, 2010

(65) Prior Publication Data

US 2011/0056913 A1 Mar. 10, 2011

Related U.S. Application Data

(60) Provisional application No. 61/239,350, filed on Sep. 2, 2009.

(51) Int. Cl.
*C23F 1/46* (2006.01)
*C23F 1/00* (2006.01)
*C23F 1/08* (2006.01)

(52) U.S. Cl.
USPC ............ 156/345.21; 156/345.43; 156/345.47; 156/345.15; 156/345.18

(58) Field of Classification Search
USPC ............. 156/345.21, 345.18, 345.15, 345.43, 156/345.47
See application file for complete search history.

(56) References Cited

U.S. PATENT DOCUMENTS

| | | | |
|---|---|---|---|
| 4,002,778 A | 1/1977 | Bellis et al. | |
| 4,181,760 A | 1/1980 | Feldstein | |
| 4,311,551 A | 1/1982 | Sykes | |
| 4,737,446 A | 4/1988 | Cohen et al. | |
| 4,981,725 A | 1/1991 | Nuzzi et al. | |
| 5,151,168 A | 9/1992 | Gilton et al. | |
| 5,318,803 A | 6/1994 | Bickford et al. | |
| 5,380,560 A | 1/1995 | Kaja et al. | |
| 5,382,447 A | 1/1995 | Kaja et al. | |
| 5,486,234 A | 1/1996 | Contolini et al. | |
| 5,576,052 A | 11/1996 | Arledge et al. | |
| 5,674,787 A | 10/1997 | Zhao et al. | |
| 5,695,810 A | 12/1997 | Dubin et al. | |

(Continued)

FOREIGN PATENT DOCUMENTS

| | | |
|---|---|---|
| CN | 101195917 | 6/2008 |
| GB | 1400510 | 7/1975 |

(Continued)

OTHER PUBLICATIONS

Machine Generated English Translation of JP 2005-187865 published Jul. 14, 2005.*

(Continued)

*Primary Examiner* — Sylvia R MacArthur
(74) *Attorney, Agent, or Firm* — Weaver Austin Villeneuve & Sampson LLP

(57) ABSTRACT

Methods and apparatus for isotropically etching a metal from a work piece, while recovering and reconstituting the chemical etchant are described. Various embodiments include apparatus and methods for etching where the recovered and reconstituted etchant is reused in a continuous loop recirculation scheme. Steady state conditions can be achieved where these processes are repeated over and over with occasional bleed and feed to replenish reagents and/or adjust parameters such as pH, ionic strength, salinity and the like.

15 Claims, 5 Drawing Sheets

(56) References Cited

U.S. PATENT DOCUMENTS

| | | | |
|---|---|---|---|
| 5,770,095 A | 6/1998 | Sasaki et al. |
| 5,824,599 A | 10/1998 | Schacham-Diamond et al. |
| 5,891,513 A | 4/1999 | Dubin et al. |
| 5,897,375 A | 4/1999 | Watts et al. |
| 5,913,147 A | 6/1999 | Dubin et al. |
| 5,969,422 A | 10/1999 | Ting et al. |
| 5,972,192 A | 10/1999 | Dubin et al. |
| 6,065,424 A | 5/2000 | Shacham-Diamond et al. |
| 6,136,707 A | 10/2000 | Cohen |
| 6,139,763 A | 10/2000 | Ina et al. |
| 6,174,353 B1 | 1/2001 | Yuan et al. |
| 6,181,013 B1 | 1/2001 | Liu et al. |
| 6,184,124 B1 | 2/2001 | Hasegawa et al. |
| 6,197,181 B1 | 3/2001 | Chen |
| 6,197,364 B1 | 3/2001 | Paunovic et al. |
| 6,214,696 B1 | 4/2001 | Wu |
| 6,270,619 B1 | 8/2001 | Suzuki et al. |
| 6,293,850 B1 | 9/2001 | Lin et al. |
| 6,309,981 B1 | 10/2001 | Mayer et al. |
| 6,329,284 B2 | 12/2001 | Maekawa |
| 6,342,733 B1 | 1/2002 | Hu et al. |
| 6,355,153 B1 | 3/2002 | Uzoh et al. |
| 6,391,188 B1 | 5/2002 | Goosey |
| 6,394,114 B1 | 5/2002 | Gupta |
| 6,398,855 B1 | 6/2002 | Palmans et al. |
| 6,524,167 B1 | 2/2003 | Tsai et al. |
| 6,537,416 B1 | 3/2003 | Feng et al. |
| 6,586,342 B1 | 7/2003 | Mayer et al. |
| 6,645,567 B2 | 11/2003 | Chebiam et al. |
| 6,664,122 B1 | 12/2003 | Andryuschenko et al. |
| 6,692,546 B2 | 2/2004 | Ma et al. |
| 6,692,873 B1 | 2/2004 | Park |
| 6,709,563 B2 | 3/2004 | Nagai et al. |
| 6,713,122 B1 | 3/2004 | Mayer et al. |
| 6,716,753 B1 | 4/2004 | Shue et al. |
| 6,774,041 B1 | 8/2004 | Kondo et al. |
| 6,775,907 B1 | 8/2004 | Boyko et al. |
| 6,815,349 B1 | 11/2004 | Minshall et al. |
| 6,884,724 B2 | 4/2005 | Hsu et al. |
| 6,887,776 B2 | 5/2005 | Shang et al. |
| 6,975,032 B2 | 12/2005 | Chen et al. |
| 6,984,166 B2 | 1/2006 | Maury et al. |
| 7,001,854 B1 | 2/2006 | Papasouliotis et al. |
| 7,008,871 B2 | 3/2006 | Andricacos et al. |
| 7,037,854 B2 | 5/2006 | Bachrach et al. |
| 7,049,234 B2 | 5/2006 | Cheng et al. |
| 7,056,648 B2 | 6/2006 | Cooper et al. |
| 7,097,538 B2 | 8/2006 | Talieh et al. |
| 7,124,386 B2 | 10/2006 | Smith et al. |
| 7,217,649 B2 | 5/2007 | Bailey et al. |
| 7,262,504 B2 | 8/2007 | Cheng et al. |
| 7,285,494 B2 | 10/2007 | Cheng et al. |
| 7,338,908 B1 | 3/2008 | Koos et al. |
| 7,449,098 B1 | 11/2008 | Mayer et al. |
| 7,491,252 B2 | 2/2009 | Bian |
| 7,531,463 B2 | 5/2009 | Koos et al. |
| 7,605,082 B1 | 10/2009 | Reid et al. |
| 7,811,925 B1 | 10/2010 | Reid et al. |
| 7,972,970 B2 | 7/2011 | Mayer et al. |
| 8,043,958 B1 | 10/2011 | Reid et al. |
| 8,158,532 B2 | 4/2012 | Mayer et al. |
| 8,372,757 B2 | 2/2013 | Mayer et al. |
| 8,415,261 B1 | 4/2013 | Reid et al. |
| 2001/0034125 A1 | 10/2001 | Uozumi |
| 2001/0038448 A1 | 11/2001 | Jun et al. |
| 2002/0061635 A1 | 5/2002 | Lee et al. |
| 2002/0084529 A1 | 7/2002 | Dubin et al. |
| 2002/0092827 A1 | 7/2002 | Sun et al. |
| 2002/0108861 A1 | 8/2002 | Emesh et al. |
| 2003/0001271 A1 | 1/2003 | Uozumi |
| 2003/0003711 A1 | 1/2003 | Modak |
| 2003/0059538 A1 | 3/2003 | Chung et al. |
| 2003/0075808 A1 | 4/2003 | Inoue et al. |
| 2003/0176049 A1 | 9/2003 | Hegde et al. |
| 2003/0190426 A1 | 10/2003 | Padhi et al. |
| 2004/0020520 A1 | 2/2004 | Kim et al. |
| 2004/0040853 A1 | 3/2004 | Marsh et al. |
| 2004/0065540 A1 | 4/2004 | Mayer et al. |
| 2004/0108302 A1 | 6/2004 | Liu et al. |
| 2004/0253740 A1 | 12/2004 | Shalyt et al. |
| 2005/0074967 A1 | 4/2005 | Kondo et al. |
| 2005/0158985 A1 | 7/2005 | Chen et al. |
| 2005/0178503 A1 | 8/2005 | Okamoto |
| 2005/0250339 A1 | 11/2005 | Shea et al. |
| 2005/0266265 A1 | 12/2005 | Cheng et al. |
| 2006/0037855 A1 | 2/2006 | Hanson et al. |
| 2006/0205204 A1 | 9/2006 | Beck |
| 2007/0105377 A1 | 5/2007 | Koos et al. |
| 2007/0131561 A1 | 6/2007 | Wang et al. |
| 2008/0286701 A1 | 11/2008 | Rath et al. |
| 2009/0014415 A1 | 1/2009 | Chelle et al. |
| 2009/0120457 A1 | 5/2009 | Naghshineh et al. |
| 2009/0280649 A1 | 11/2009 | Mayer et al. |
| 2009/0283499 A1 | 11/2009 | Mayer et al. |
| 2010/0015805 A1 | 1/2010 | Mayer et al. |
| 2010/0029088 A1 | 2/2010 | Mayer et al. |
| 2011/0056913 A1 | 3/2011 | Mayer et al. |
| 2011/0223772 A1 | 9/2011 | Mayer et al. |

FOREIGN PATENT DOCUMENTS

| | | |
|---|---|---|
| JP | 02111883 | 4/1990 |
| JP | 03122266 | 5/1991 |
| JP | 2005-187865 | 7/2005 |
| JP | 2009-160486 | 7/2009 |
| JP | 2010-232486 | 10/2010 |
| KR | 2009-0069606 | 7/2009 |
| WO | 99/47731 | 9/1999 |
| WO | WO03/098676 | 11/2003 |
| WO | 2009/023387 | 2/2009 |

OTHER PUBLICATIONS

International Search Report and Written Opinion, mailed Apr. 12, 2011, issued in Application No. PCT/US2010/043425.

International Search Report and Written Opinion, mailed Apr. 12, 2011, issued in Application No. PCT/US2010/047181.

Aksu et al., Electrochemistry of Copper in Aqueous Ethylenediamine Solutions, Journal of the Electrochemical Society, 149 (7) B340-B347 (2002).

Aksu et al., "The Role of Glycine in the Chemical Mechanical Planarization of Copper," Journal of the Electrochemical Society, 149 (6) G352-G361 (2002), Department of Materials Science and Engineering, University of California, Berkeley, Berkeley, California 94720-1760, USA.

Andryuschenko et al., "Electroless and Electrolytic Seed Repair Effects on Damascene Feature Fill," Proceedings of International Interconnect Tech. Conf., San Francisco Ca., Jun. 4-6, 2001, pp. 33-35.

Chen et al., "ECD Seed Layer for Inlaid Copper Metallisation," Semiconductor Fabtech—12$^{th}$ Edition, 5 Pages, Jul. 2000.

Choi et al, Dissolution Behaviors of Copper Metal in Alkaline $H^2O^2$-EDTA Solutions, Journal of Nuclear Science and Technology, 30(6), pp. 549-553 (Jun. 1993).

E.G. Colgan, "Selective CVD-W for Capping Damascene Cu Lines," Thin Solid Films, 262 (1995), 120-123.

Enhanced Copper Metallurgy for BEOL Application, IBM Technical Disclosure Bulletin, vol. 33, No. 5, (1990), 217-218).

Eugene J. O'Sullivan, "Electroless Deposition in Microelectronics: New Trend," (2000) Electrochemical Society Proceeding vol. 99-34, 159-171.

Hu et al., "Effects of Overlayers on Electromigration Reliability Improvement for Cu/Low K Interconnects," Presented in the Proceedings of the 42$^{nd}$ Annual IRPS held Apr. 25-29, 2004, p. v, article published May 28, 2004, 7 Pages.

Hu et al., "Reduced Electromigration of Cu Wires by Surface Coating," Applied Physics Letters, vol. 81, No. 10, (2002), 1782-1784.

Ken M. Takahashi, "Electroplating Copper into Resistive Barrier Films," Journal of the Electrochemical Society, 147 (4) 1417-1417 (2000).

(56) References Cited

OTHER PUBLICATIONS

Korean Office Action for Application No. 10-2009-0067246 mailed Mar. 23, 2011.
Mayer et al., "Pad-Assisted Electropolishing," Novellus Systems, Inc., U.S. Appl. No. 11/213,190, filed Aug. 26, 2005.
Mayer et al., "Topography Reduction and Control by Selective Accelerator Removal," Novellus Systems, Inc., U.S. Appl. No. 11/602,128, filed Nov. 20, 2006.
Mori et al., "Metal Capped Cu Interconnection Technology by Chemical Mechanical Polishing," VMIC Conference, 1996, 487-492.
Mukherjee et al., "Planarization of Copper Damascene Interconnects by Spin-Etch Process: A Chemical Approach", Mat. Res. Soc. Symp. vol. 612 © 2000 Materials Research Society.
N. Petrov and Y. Shacham-Diamand, "Electrochemical Study of the Electroless Deposition of Co(W,P) Barrier Layers for Cu Metallization,", (2001) Electrochemical Soc. Proceedings vol. 2000-27, 134-148.
Park et al., "Electroless Layer Plating Process and Apparatus", Novellus Systems, Inc., U.S. Appl. No. 10/235,420, filed Sep. 30, 2002.
Patri et al., Role of the Functional Groups of Complexing Agents in Copper Slurries, Journal of The Electrochemical Society, 153 (7) G650-G659 (2006).
Reid et al., "Capping Before Barrier-Removal IC Fabrication Method", Novellus Systems, Inc., U.S. Appl. No. 12/875,857, filed Sep. 3, 2010.
Reid et al., "Copper PVD and Electroplating," Solid State Technology, Jul. 2000, www.solid-state.com, 86-103.
Reid et al., "Factors Influencing Fill of IC Features Using Electroplated Copper," Adv Met Conf Proc 1999, MRS 10 Pages, (2000).
Reid et al., "Optimization of Damascene Feature Fill for Copper Electroplating Process," Shipley Company, IITC 1999, 3 Pages.
Ritzdorf et al., "Electrochemically Deposited Copper," Conference Proceedings ULSI XV 2000, Materials Research Society, 101-107.
Shacham-Diamond et al., "Copper Electroless Deposition Technology for Ultr-Large-Scale-Integration (ULSI) Metallization," Microelectronic Engineering 33 (1997) 47-58.
Sullivan et al, Electrolessly Deposited Diffusion Barriers for Microelectronics, E. J. IBM J Res Develop vol. 42, No. 4 Sep. 1998, 607-620.
T. Itabashi et al., "Electroless Deposited CoWB for Copper Diffusion Barrier Metals," Hitachi Research Laboratory, IEEE, 2002, 285-287.
T.P. Moffat et al., "Superconformal Electrodeposition of Copper in 500-90 nm Features," Journal of the Electrochemical Society, 147 (12) 4524-4535 (2000).
Theoretical Studies on the Electroless Metal Deposition Reaction Mechanism Group, printed from website http://www.appchem.waseda.ac.jp on Jul. 3, 2002. Published prior to the filing of this application. 3 Pages.
Wolf, Silicon Processing for the VLSI Era, (1995) Lattice Press, vol. 3, p. 648.
Yosi Shacham-Diamand and Sergey Lopatin, "Integrated Electroless Metallization for ULSI," Elecrochimica Acta, (44 (19999) 3639-3649.
U.S. Office Action dated Sep. 1, 2005 for U.S. Appl. No. 10/235,420.
U.S. Office Action mailed Aug. 16, 2006 from U.S. Appl. No. 10/742,006.
U.S. Office Action mailed Nov. 30, 2006 from U.S. Appl. No. 10/690,084; 6 pages.
U.S. Office Action mailed Aug. 2, 2007 from U.S. Appl. No. 10/690,084.
Notice of Allowance mailed Oct. 2, 2007 from U.S. Appl. No. 10/690,084 and Allowed Claims.
Office Action mailed Jul. 27, 2007, from U.S. Appl. No. 11/586,394.
U.S. Office Action mailed Nov. 26, 2007 from U.S. Appl. No. 11/586,394.
U.S. Final Office Action mailed Jun. 12, 2008 from U.S. Appl. No. 11/586,394.
Notice of Allowance mailed Mar. 13, 2009 for U.S. Appl. No. 11/586,394 and Allowed Claims.
U.S. Office Action mailed Aug. 10, 2010 for U.S. Appl. No. 11/888,312.
U.S. Office Action mailed Jan. 23, 2007, from U.S. Appl. No. 11/251,353.
U.S. Final Office Action mailed Jul. 18, 2007 from U.S. Appl. No. 11/251,353.
U.S. Office Action mailed Feb. 8, 2008 from U.S. Appl. No. 11/251,353.
Notice of Allowance mailed May 13, 2008, from U.S. Appl. No. 11/251,353 and Allowed Claims.
Notice of Allowance mailed Jun. 11, 2010 for U.S. Appl. No. 12/184,145 and Allowed Claims.
U.S. Appl. No. 12/462,424, filed Aug. 4, 2009.
U.S. Appl. No. 13/725,308, filed Dec. 21, 2012.
US Final Office Action dated Dec. 10, 2012 issued in U.S. Appl. No. 11/890,790.
US Final Office Action dated Jun. 10, 2011 issued in U.S. Appl. No. 11/890,790.
US Notice of Allowance dated Dec. 16, 2011 issued in U.S. Appl. No. 11/602,128.
US Notice of Allowance dated Feb. 21, 2013 issued in U.S. Appl. No. 11/890,790.
US Notice of Allowance dated Jul. 12, 2011 for U.S. Appl. No. 12/875,857 and Allowed Claims.
US Notice of Allowance dated Mar. 14, 2013 issued in in U.S. Appl. No. 13/116,963.
US Notice of Allowance dated May 19, 2011 in U.S. Appl. No. 11/888,312.
US Notice of Allowance dated May 11, 2011 issued in U.S. Appl. No. 11/602,128.
US Notice of Allowance dated Nov. 26, 2012 issued in U.S. Appl. No. 13/270,809.
US Notice of Allowance dated Oct. 1, 2012 issued in U.S. Appl. No. 12/535,594.
US Office Action dated Apr. 26, 2012 issued in U.S. Appl. No. 12/462,424.
US Office Action dated Aug. 3, 2012 issued in in U.S. Appl. No. 13/116,963.
US Office Action dated Dec. 27, 2010 issued in U.S. Appl. No. 11/890,790.
US Office Action dated Dec. 4, 2008 in U.S. Appl. No. 11/586,394.
US Office Action dated Jun. 22, 2012 issued in U.S. Appl. No. 11/890,790.
US Office Action dated Mar. 9, 2012 issued in U.S. Appl. No. 12/535,594.
US Office Action dated Nov. 19, 2012 issued in U.S. Appl. No. 12/462,424.
US Office Action dated Oct. 20, 2010 issued in U.S. Appl. No. 11/602,128.
JP Office Action dated Dec. 18, 2012 issued in Application No. 2009-207571.
KR Office Action dated May 28, 2012 issued in Application No. 10-2010-7027667.
KR Office Action dated Oct. 24, 2011 issued in Application No. 10-2010-7027667.
SG Office Action dated Oct. 27, 2011 issued in Application No. 200905176-4.
TW Office Action dated Feb. 23, 2013 issued in TW Application No. 099129741.
TW Search Report dated Oct. 15, 2012 issued in Application No. 098125712.

\* cited by examiner

REDUCED ISOTROPIC ETCHANT MATERIAL CONSUMPTION AND WASTE GENERATION

CROSS-REFERENCE TO RELATED APPLICATIONS

This application claims the benefit of and priority to U.S. Provisional Application Ser. No. 61/239,350 filed Sep. 2, 2009, the contents of which are incorporated herein by reference in their entirety and for all purposes.

FIELD OF THE INVENTION

This invention pertains to methods of wet chemical etching. More particularly this invention pertains to methods and apparatus for regenerating and reusing wet etchant for copper removal and planarization in semiconductor processing.

BACKGROUND

Isotropic etching is non-directional removal of material from a substrate via a chemical process using an etchant. Etchants can include liquids and plasmas. Liquid chemical etchants are typically corrosive, containing acids or bases and other agents to enhance the etchants ability to remove material from a work piece. Such etchants are used, for example, to efficiently remove unwanted material from a work piece. Isotropic etching is particularly useful for removing unwanted metal, for example copper, from semiconductor wafers.

Isotropic etching metal from a work piece typically produces large volumes of waste, on the order of tens of liters per hour, for example, to process semiconductor wafers through a single etch apparatus. This waste, although moderately dilute, can contain many environmental poisons including metal ions, for example copper. Also, feed stocks for creating the liquid etchant are expensive. Handling large volumes of caustic and toxic waste presents a major challenge, for example, in semiconductor processing where large numbers of work pieces are processed daily.

SUMMARY

Methods and apparatus for isotropically etching a metal from a work piece, while recovering and reconstituting the chemical etchant are described. Various embodiments include apparatus and methods for etching where the recovered and reconstituted etchant is reused in a continuous loop recirculation scheme. Steady state conditions can be achieved where these processes are repeated over and over with occasional bleed and feed to replenish reagents and/or adjust parameters such as pH, ionic strength, salinity and the like. This saves from having to process huge waste streams and takes advantage of synergies between processes as described herein.

One embodiment is an apparatus for processing a work piece, including: (a) a wet chemical etching chamber for removing a metal from a surface of the work piece with a peroxide-based etchant, the wet chemical etching chamber in fluid communication with and upstream of; (b) an electrowinning module for removing ions of the metal from the peroxide-based etchant after it exits the wet chemical etching chamber; and (c) a regeneration system configured to reintroduce one or more reagents into the peroxide-based etchant after it exits the wet chemical etching chamber in order to regenerate the peroxide-based etchant and reintroduce it into the wet chemical etching chamber. Apparatus may further include a decomposition tank configured to allow substantial decomposition of a peroxide in the peroxide-based etchant after exiting the wet chemical etching chamber and before entering the electrowinning module. Regeneration systems may include: a peroxide inlet for introducing the peroxide into the peroxide-based etchant after the peroxide-based etchant exits the electrowinning module, the peroxide inlet proximate to an etchant inlet of the wet chemical etching chamber; and one or more make-up feeds for adding at least one of water, a metal chelator and a pH adjuster to the peroxide-based etchant. Apparatus may further include a buffer tank configured to store a volume of the peroxide-based etchant after it exits the electrowinning module, the buffer tank configured upstream of the peroxide inlet.

Another embodiment is a method for processing a work piece, including: (a) wet chemical etching a metal from a surface of the work piece with a peroxide-based etchant; (b) electrowinning ions of the metal from the peroxide-based etchant after wet chemical etching; (c) regenerating the peroxide-based etchant by adding one or more reagents to the electrowinned peroxide-based etchant; and (d) reusing the regenerated peroxide-based etchant for wet chemical etching. Methods may further include passing the peroxide-based etchant through a decomposition tank, after wet chemical etching and before electrowinning, in order to decompose a peroxide in the peroxide-based etchant. Methods described herein are particularly useful for etching copper. Copper concentrations from the used etchant solution are reduced to low levels, in one embodiment, less than about 200 ppm of copper ions, in another embodiment less than about 100 ppm of copper ions. One or more reagents added to the stabilized and electrowinned etchant include least one of water, a peroxide, a metal chelator and a pH adjuster. In one embodiment, the pH adjuster includes an organic and/or and inorganic base. Methods of monitoring the etch, decomposition and/or electrowinning are described where data collected is used to maintain a substantially steady state etchant composition for etching in a recirculation format where the used etchant is regenerated and used again. In one embodiment, determining how much of each, of the one or more reagents to add to the electrowinned peroxide based etchant is achieved by analyzing the electrowinned peroxide-based etchant to determine at least one of pH, salt concentration, peroxide concentration, metal ion concentration, ionic strength, chelator concentration and the like.

Another embodiment is a method of reducing the volume of a waste stream produced by etching copper with a chemical etchant, including: (a) electrowinning copper ions from the waste stream until a copper ion concentration of about 200 ppm or less is reached; and (b) reconstituting the chemical etchant using the electrowinned waste stream and one or more reagents; and (c) reusing the reconstituted chemical etchant to further etch copper.

These and other features and advantages are further discussed below with reference to the associated drawings.

DETAILED DESCRIPTION

Figure 1:
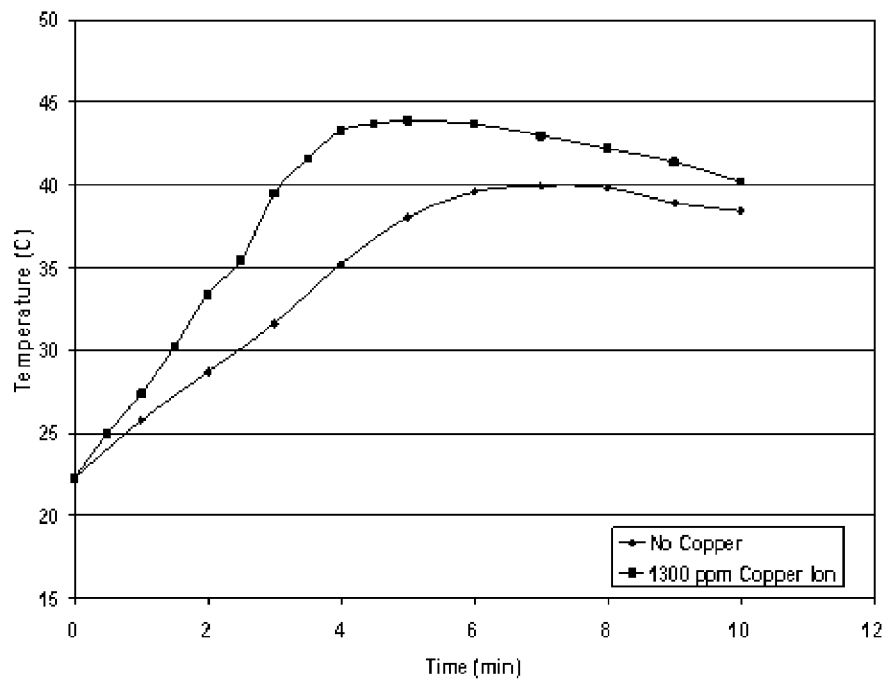
FIG. 1 is a plot of the solution temperature vs. time of an etch solution after the addition of hydrogen peroxide.

While methods for efficient copper removal are desirable at various stages of semiconductor device fabrication, conventional wet copper etching techniques have not been widely introduced because of their anisotropic nature. Anisotropic etching leads to preferential etching of copper in one specific direction and/or preferential etching of one type of grain orientation and, consequently, leads to roughening of copper surface, pitting, and grain boundary dependent non-uniform copper removal. Therefore isotropic removal of copper is commonly desired.

Exemplary isotropic etchants, methods and apparatus are described in the following: U.S. Pat. No. 7,531,463, filed Oct. 24, 2006 (Koos, et. al.), U.S. Pat. No. 7,338,908, filed Oct. 20, 2003 (Koos, et. al.), U.S. patent application Ser. No. 11/602,128, filed Nov. 20, 2006 (Mayer et al.), U.S. patent application Ser. No. 11/888,312, filed Jul. 30, 2007 (Mayer et al.), U.S. patent application Ser. No. 12/462,424, filed Aug. 4, 2009 (Mayer et al.), and U.S. patent application Ser. No. 12/535,594, filed Aug. 4, 2009 (Mayer et al.), each of which is herein incorporated by reference in its entirety.

Isotropic etch systems typically create an in-line mixture of "fresh" metal etching chemicals that are used once (single pass) and then the spent solution is treated as waste. For example, an etch stream is created by combining a solvent, for example water, an isotropic copper chelator concentrate, typically containing one or more amino acids and/or di-, tri- and tetra-amines (e.g. glycine, ethylene diamine), and typically one or more neutralizing agents. A specific example of a copper chelator concentrate is Novellus composition ChemX-GSA2™, available though ATMI Industries of Danbury, Conn. The concentrate and water streams are mixed with an oxidizer, typically a peroxide, for example 30% hydrogen peroxide, to form an active isotropic etch solution.

The isotropic etch may have a number of very favorable characteristics, including grain independent and feature size, depth and density independency, as well as minimal surface roughening (i.e. the surface remains bright, even after removing 10 or more microns of metal). The costs of the raw chemicals and the volume of total waste generated are very favorable versus the major competitive processes, for example copper chemical mechanical polishing (CMP).

Among the current technical issues with isotropic etching is the need to process and eventually treat a relatively large liquid waste volume that is moderately dilute. Also, the waste stream contains an environmental poison, copper. In some cases, this stream may be as large as 25 liters per hour from a single processing module (e.g. if the etch process must remove 40-50 μm of plated metal), and has a copper content in the range of about 0.1%, or 1000 ppm. For comparative purposes, this waste stream volume is about 10-50 times that of a typical Sabre™ plating tool (a copper electrofill tool available from Novellus Systems, Inc. of San Jose, Calif.), which produces on the order of 0.62-1.25 liters per hour of concentrated waste (about 4% copper, or 40,000 ppm) and is about ⅓ the volume of the Sabre EBR™ (edge bevel removal tool, also available from Novellus Systems, Inc. of San Jose, Calif.) which produces about 100 liters per hour of rinse waste (10-50 ppm copper). The exact values of course depend on tool particular application, throughput, utilization, and other operating conditions.

In a typical waste treatment scheme not involving the etch solution, concentrated plating solution is typically first kept as a separate waste stream from the rinse waste, and may be electrowinned down to a copper concentration of less than about 200 ppm. Then this small volume acidic waste is mixed with the larger volume, less acidic, low copper rinsate stream, the combined streams are pH modified to between about pH 4 and about 5, where they are then passed though a series ion exchange resins, exiting the treatment as a near neutral low copper content (typically between 1-5 ppm) waste stream.

The mixing of the plating waste streams with etch waste streams, having a very different volumes, metal concentrations, pH, oxidizer content and other constituents, was found to be not fully compatible, or economically and environmentally optimal.

The inventors have found that, in addition to being non-optimal to simply mix the plating tool waste with the etch waste because of their incongruent volume and metal ion concentration, the etch solution is alkaline (pH 8-11) and contains an oxidizer and hence has other incompatibilities. This difference in the waste streams presents some unique problems. It was recognized as favorable (from a waste treatment perspective) that the hydrogen peroxide oxidizer in the etch solution breaks down rapidly (in about 10 minutes) to oxygen and water and therefore is a stable waste product. The decomposition process is exothermic, creating oxygen and water, and can be monitored by measuring the adiabatic temperature rise of a decomposing solution, the results of such measurement are presented in equation (1).

$$H_2O_2 \rightarrow H_2O + \tfrac{1}{2}O_2 \quad \Delta H_{react} = -23.4 \text{ kcal/mole} \tag{1}$$

The decomposition of a typical etch solution, for example a 4 percent solution by weight (1.18 M) of hydrogen peroxide solution, would release 23.4×1.18=−27.6 kcal/liter and have a heat capacity of about 0.98 Kcal/L, so the adiabatic temperature increase for the complete decomposition of such a solution would be as in equation (2), a value $$\Delta T = -\Delta H/C_P = 27.6/0.98 = 28.2° \text{ C}. \tag{2}$$

commensurate with measurements where the decomposition is rapid (nearly adiabatic). However, the oxidizer break down rate is a strong non-linear function of pH (described in more detail below), and therefore simply combining the etch waste with various acidic waste streams can create a number of challenges in chemical handling, treatment and safety.

By measuring the time to reach a maximum temperature one can approximate this value with the average time (rate) of the peroxide decomposition. FIG. 1 is a plot of the solution temperature vs. time of an etch solution after the addition of hydrogen peroxide. The solutions were made by combining a) 80 mL of an etch concentrate electrolytic "precursor", b) 0 or 1.3 g metallic copper powder, c) 800 ml of deionized (DI) water and, just prior to starting the experiment, d) 133 g (120 ml) of 30% hydrogen peroxide in water. One liter of the etch concentrate contained approximately 231 ml/L 98% ethylene diamine, 198 g/L glycine, 8.8 ml/L glacial acetic acid, 3.9 ml/L 96% sulfuric acid and 718 mL of DI water. This combination of a-d initially creates a etch solution having 4%/wt hydrogen peroxide, 8% etch concentrate, and, after reaction, contains either 0 or 1300 ppm dissolved copper. The latter copper concentration represents a typical copper concentration of the used etch solution after etching copper from a 300 mm wafer. Thus FIG. 1 shows comparison of decomposition of 4% $H_2O_2$, 8% etch concentrate solution in water, approximating the composition of isotropic etch waste, with and without copper. Referring to FIG. 1, the maximum temperature is reached in about 7 minutes without copper in the solution, and in about 4.5 minutes with 1300 ppm of copper, indicating that copper may catalyze the rate of hydrogen peroxide decomposition. Bubbling of the solution is clearly visible during this period prior to reaching the temperature peak.

Figure 2:
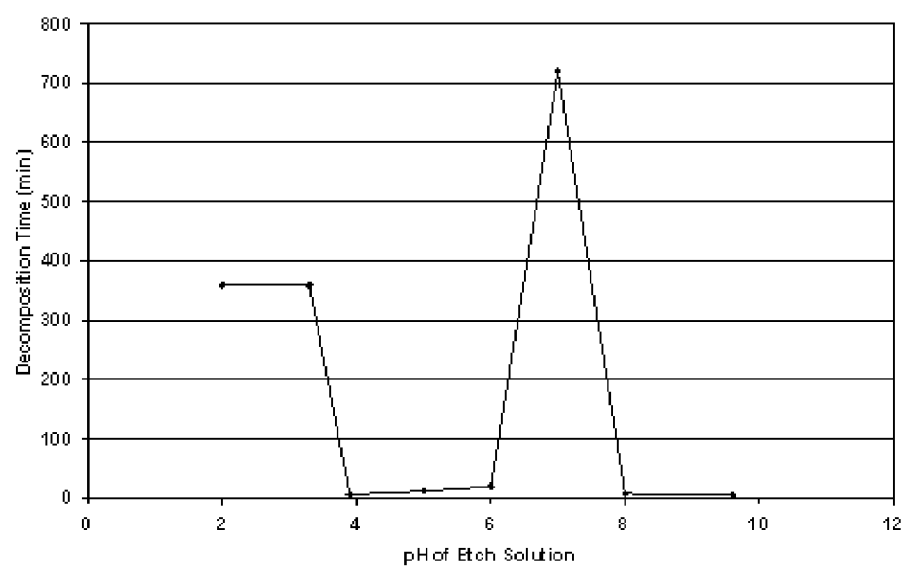
FIG. 2 is a plot of estimated time of the etch solution described in relation to FIG. 1 to decompose as a function of pH.
Figure 3:
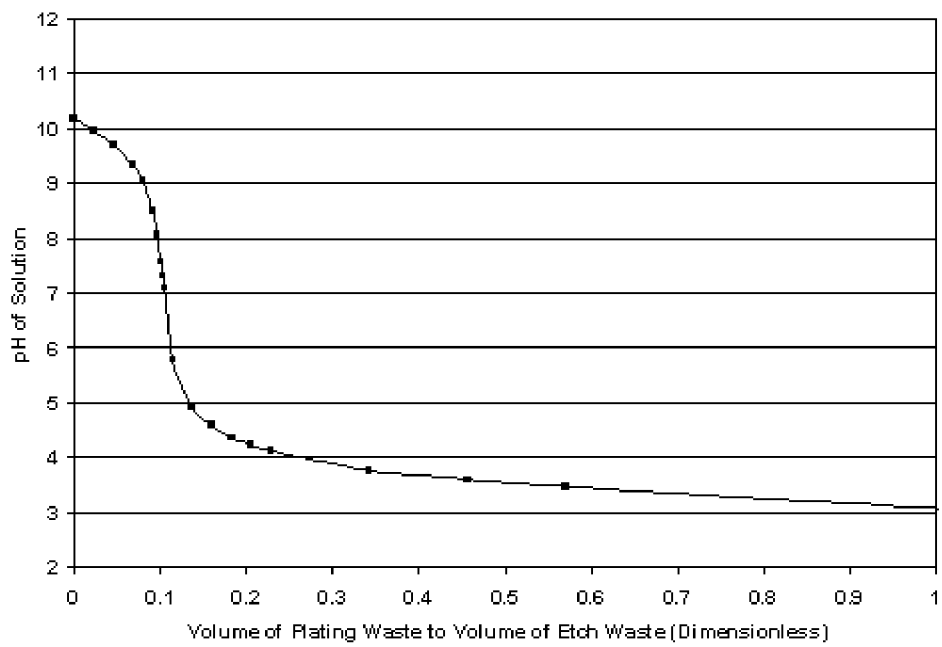
FIG. 3 is a pH titration curve of the etch solution from FIG. 1 using copper plating solution as the titrant.

FIG. 2 is a plot of the decomposition of the etch solution described in relation to FIG. 1 as a function of pH. The pH was adjusted by titrating the etch solution before adding the peroxide with a copper plating solution (pH of about 0.45, 20 g/L methane sulphonic acid, 80 g/L copper methane sulphonate, 50 ppm $Cl^-$). FIG. 3 is the pH titration curve of the etch solution using the copper plating solution as the titrating agent. The estimate of the peroxide decomposition over time is made from measuring the time to maximum temperature (similar to FIG. 1), or, in the case of very long decomposition times, the measured time for the solution etch rate of copper to drop below 50 Å/min. At the lower pH ranges the acidity tends to reduce the rate of decomposition, but the increasing copper is likely compensating for this reduction by catalyzing the decomposition.

What can be concluded from FIGS. 2 and 3 is that at some conditions (near pH 7 and at low pH with high copper), the peroxide breakdown rate is relatively slow. This creates a potential for waste which exits the tool to have its rate of decomposition reduced and be temporarily "stabilized" by mixing with acidic plating or rinse waste. However, if the pH of the mixed waste were to later change (e.g. from pH 7 to pH 4, or from pH<3 to pH 4-6) the stored peroxide in the solution and heat and gas would be rapidly released in a waste storage tank. Avoiding such an unpredictable and potentially hazardous situation is therefore desirable. Also, the inventors have found that once the peroxide in the used etch solution is decomposed, the remaining components of the etch solution are essentially intact, except that the solution contains higher than desired copper concentration. Thus surprisingly, the inventors have found that if such etch solutions are "stabilized" by decomposition of the peroxide, and the copper removed, for example by electrowinning down to an acceptable level, for example less than about 200 ppm, then the resulting solution can be used to regenerate the etch solution by adding fresh hydrogen peroxide. In certain embodiments, this cycle is repeated in a loop fashion, with some maintenance of the recycling loop, for example, occasionally bleeding off some of the solution and adding pH adjusters, water, amines and the like, to maintain a substantially steady state etchant composition in a recycling loop format.

In one embodiment, a general etch solution recycling method along with some exemplary process schemes and associated apparatus, are useful in reducing the amount of chemical used and waste created in an isotropic metal removal etch process by about 90% or more are described. In certain embodiments, the method and apparatus can be performed on- or off-board a semiconductor plating tool. In one example, a recycling method and associated exemplary apparatus includes four core operations and/or components: 1) a metal (e.g. copper) etching chamber (e.g. Sabre etching module) which uses a stream (e.g. spray) of (preferably isotropic) etchant containing a solvent (e.g. water), which is a carrier of the etch chelating chemical(s) and pH adjusting component(s), and dissolved oxidizer(s), 2) An etch oxidizer decomposition tank suitably designed to allow for most or substantially all of the peroxide component of the etch solution to be broken down and the break-down product separated from the etch solution, 3) an electrowinning cell (or other suitable cell that removes dissolved metal etched from the wafer surface in the etching chamber) and deposits the metal on, e.g., a series of porous flow though cathode collector plates, the electrowinning creating a low metal content solution that replenishes etch chelating solution, and 4) a recirculation system including mechanisms for pumping the replenished etch chelating solution obtained after processes (2) and (3) and combining the reclaimed chemical in-line with fresh oxidizing agent (e.g. Hydrogen peroxide), so that it can be reused to etch subsequent wafers. Various process monitoring, modifying and controlling, and a bleed and feed capability are also described.

Thus, one embodiment is a method for processing a work piece, including: (a) wet chemical etching a metal from a surface of the work piece with a peroxide-based etchant; (b) removing, for example by electrowinning, ions of the metal from the peroxide-based etchant after wet chemical etching; (c) regenerating the peroxide-based etchant by adding one or more reagents to the electrowinned peroxide-based etchant; and (d) reusing the regenerated peroxide-based etchant for wet chemical etching. In one embodiment, the method further includes passing the peroxide-based etchant through a decomposition tank, after wet chemical etching and before removing the metal ions, for example by electrowinning, in order to decompose a peroxide in the peroxide-based etchant. In one embodiment, electrowinning is used to remove the metal ions. In one embodiment, the metal is copper. In another embodiment, greater than about 50% of the peroxide in the peroxide-based etchant is decomposed without applying heat or additional reagents to the peroxide-based etchant in the decomposition tank. In another embodiment, greater than about 50% of the peroxide in the peroxide-based etchant is decomposed and a decomposition catalyst is added to the peroxide-based etchant. In another embodiment, where electrowinning is used, the electrowinning is performed until the peroxide-based etchant includes less than about 200 ppm of copper ions, in another embodiment less than about 100 ppm of copper ions. In one embodiment, the one or more reagents includes at least one of water, a peroxide, a metal chelator and a pH adjuster. In one embodiment, the peroxide is hydrogen peroxide. In another embodiment, the metal chelator is an amine. In this description, the term "amine" refers to a molecule containing an amino functionality, for example, ethylenediamine, ammonia, aniline, and amino acids are all amines. In one embodiment, the amines (and etch solutions) are described in the aforementioned one or more patents and patent applications incorporated by reference above.

In one embodiment, the method further includes removing a portion of the peroxide-based etchant to compensate for the addition of the one or more reagents to the electrowinned peroxide-based etchant. In another embodiment, the method further includes determining which, and how much of each, of the one or more reagents to add to the electrowinned peroxide based etchant by analyzing the electrowinned peroxide-based etchant to determine at least one of pH, salt concentration, peroxide concentration, metal ion concentration, ionic strength and chelator concentration; and adding the one or more reagents to the electrowinned peroxide based etchant and/or removing the portion of the peroxide-based etchant in order to maintain a steady state composition of the electrowinned peroxide based etchant. In one embodiment, (a)-(d) above are performed in a recirculating fashion.

One embodiment is a method for processing a semiconductor wafer, including: (a) wet chemical etching copper from the semiconductor wafer with an etchant including hydrogen peroxide; (b) stabilizing the etchant after wet chemical etching by decomposing hydrogen peroxide in the etchant; (c) electrowinning copper ions from the etchant after stabilization; (d) regenerating the etchant by adding one or more reagents to the stabilized and electrowinned etchant; and (e) reusing the regenerated etchant for further wet chemical etching of copper.

Another embodiment is a method of reducing the volume of a waste stream produced by etching copper with a chemical etchant, including: (a) electrowinning copper ions from the waste stream until a copper ion concentration of about 200 ppm or less is reached; and (b) reconstituting the chemical etchant using the electrowinned waste stream and one or more reagents; and (c) reusing the reconstituted chemical etchant to further etch copper. In one embodiment, (a)-(c) is carried out on a waste stream created from further etching copper with the reconstituted chemical etchant. In one embodiment, the chemical etchant includes hydrogen peroxide and the hydrogen peroxide remaining in the waste stream is first decomposed before (a). In one embodiment, the one or more reagents includes at least one of water, a peroxide, a metal chelator and a pH adjuster.

Apparatus are also described. One embodiment is an apparatus for processing a work piece, including: (a) a wet chemical etching chamber for removing a metal from a surface of the work piece with a peroxide-based etchant, the wet chemical etching chamber in fluid communication with and upstream of; (b) an electrowinning module for removing ions of the metal from the peroxide-based etchant after it exits the wet chemical etching chamber; and (c) a regeneration system configured to reintroduce one or more reagents into the peroxide-based etchant after it exits the wet chemical etching chamber in order to regenerate the peroxide-based etchant and reintroduce it into the wet chemical etching chamber. In one embodiment, the apparatus further includes a decomposition tank configured to allow substantial decomposition of a peroxide in the peroxide-based etchant after exiting the wet chemical etching chamber and before entering the electrowinning module. In one embodiment, the regeneration system includes: a peroxide inlet for introducing the peroxide into the peroxide-based etchant after the peroxide-based etchant exits the electrowinning module, the peroxide inlet proximate to an etchant inlet of the wet chemical etching chamber; and one or more make-up feeds for adding at least one of water, a metal chelator and a pH adjuster to the peroxide-based etchant. In one embodiment, the apparatus further includes a buffer tank configured to store a volume of the peroxide-based etchant after it exits the electrowinning module, the buffer tank configured upstream of the peroxide inlet. In one embodiment, the decomposition tank is configured to hold the peroxide-based etchant for sufficient time such that greater than about 50% of the peroxide in the peroxide-based etchant decomposes without applying heat or additional reagents to the peroxide-based etchant in the decomposition tank. In one embodiment, the peroxide-based etchant includes an amine metal chelator and the peroxide is hydrogen peroxide.

In another embodiment, the metal is copper and the work piece is a semiconductor wafer. In one embodiment, the electrowinning module is configured to remove copper ions from the peroxide-based etchant so that the peroxide-based etchant exiting the electrowinning module includes less than about 200 ppm of copper ions, in another embodiment, less than about 100 ppm of copper ions.

In one embodiment, the apparatus is configured to deliver regenerated peroxide-based etchant to the wet chemical etching chamber in less than about 3 minutes after mixing. In another embodiment, the apparatus includes a bleed valve for removing the peroxide-based etchant from the apparatus to compensate for the one or more make-up feeds adding the at least one of water, a metal chelator and a pH adjuster to the peroxide-based etchant.

Apparatus can also include a buffer tank configured to store a volume of the peroxide-based etchant after it exits the decomposition tank, the buffer tank configured upstream of the electrowinning module. Additional features include one or more analytical probes configured to measure the peroxide-based etchant in the electrowinning module for at least one of pH, salt concentration, peroxide concentration, metal ion concentration, ionic strength and chelator concentration. One or more controllers can be included, each with an associated logic, the controller configured to operate at least the bleed valve and the one or more make-up feeds in order to maintain a steady state in the composition of the peroxide-based etchant as it exits the electrowinning module using measurements obtained from the one or more analytical probes.

Figure 5:
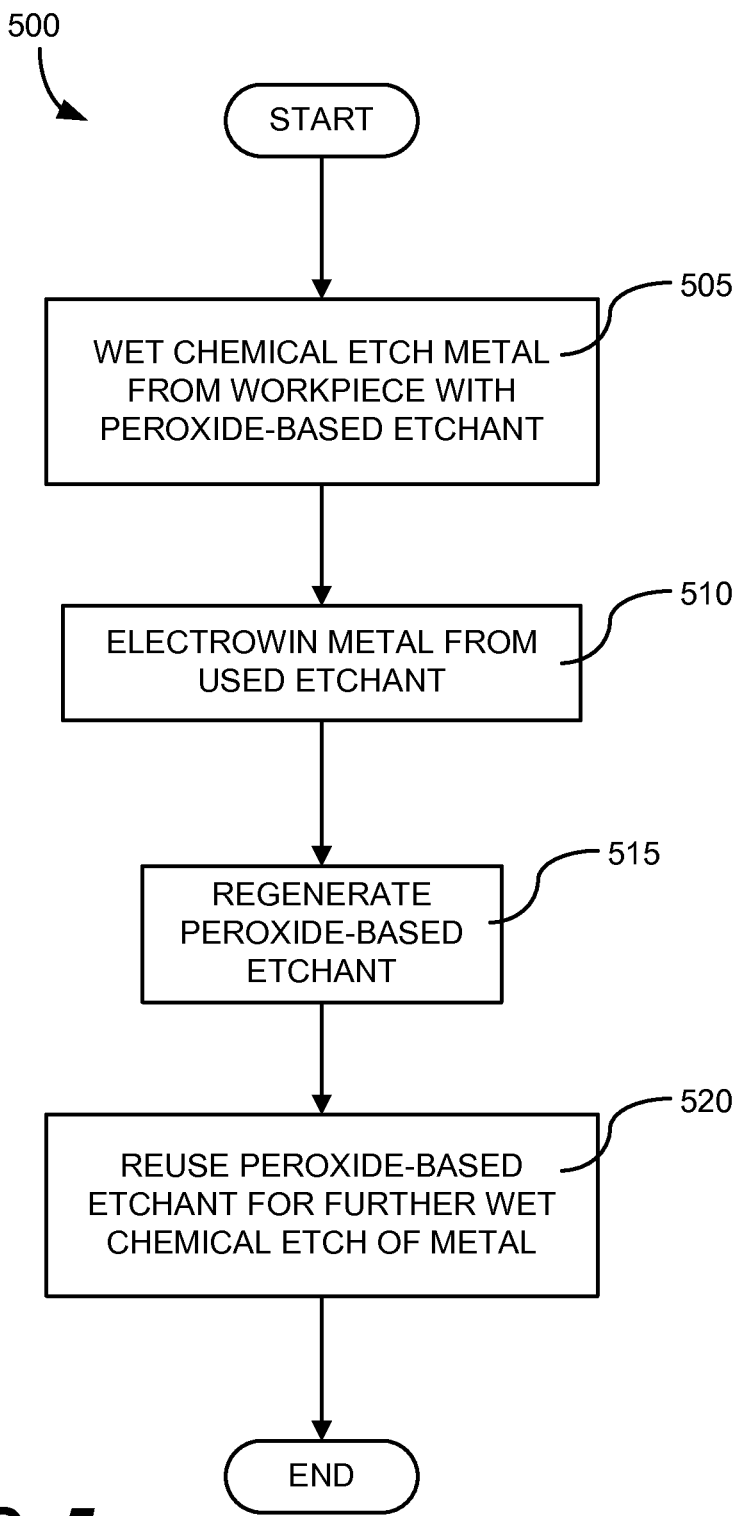
FIG. 5 is a process flow depicting aspects of a method of processing a work piece.
Figure 6:
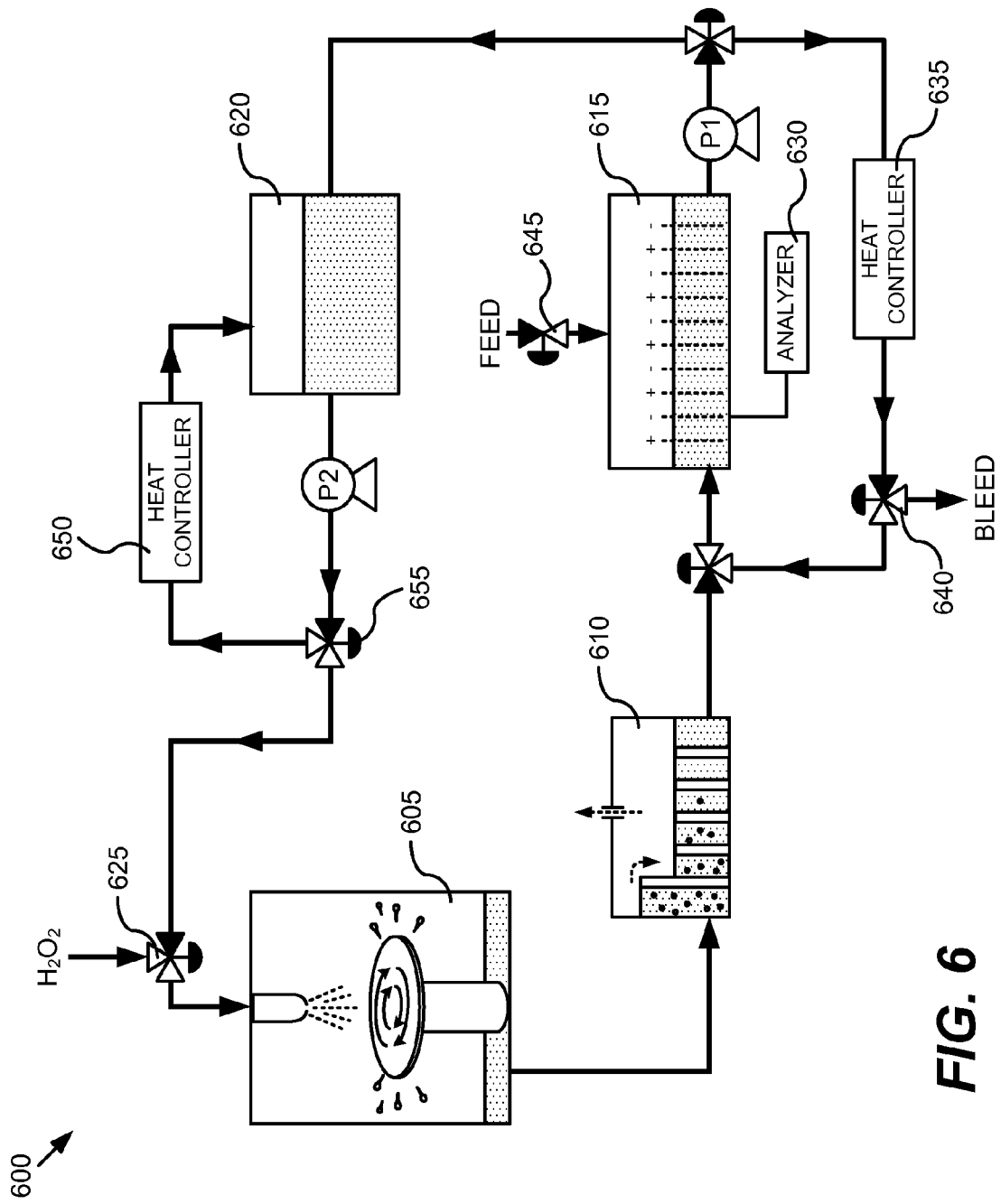
FIG. 6 is a schematic of an apparatus for processing a work piece.

Another embodiment is an apparatus for processing a semiconductor wafer, including: (a) a wet chemical etching chamber for removing copper from the semiconductor wafer with an etchant including hydrogen peroxide, the wet chemical etching chamber in fluid communication with and upstream of; (b) a decomposition tank configured to allow substantial decomposition of hydrogen peroxide in the etchant after the etchant exits the wet chemical etching chamber and before the etchant enters; (c) an electrowinning cell for removing copper ions from the etchant; (d) one or more make-up feeds for adding at least one of water, a metal chelator and a pH adjuster to the etchant in, and/or downstream of, the electrowinning cell; and (e) a peroxide inlet for introducing hydrogen peroxide into the etchant after the etchant exits the electrowinning module, the peroxide inlet proximate to an etchant inlet of the wet chemical etching chamber. In one embodiment, the apparatus further includes buffer tank configured to store a volume of the etchant after it exits the electrowinning cell, the buffer tank configured upstream of the peroxide inlet. FIG. 6, depicts such an apparatus, 600, for processing a work piece in accord with the method described in FIG. 5. FIG. 5 depicts a process flow, 500, describing aspects of a method of processing a work piece. FIG. 5 is described along with FIG. 6. The methods and apparatus described with respect to FIGS. 5 and 6 are only illustrative, the invention is not so limited. For example, a peroxide based etchant can use hydrogen peroxide and/or other peroxides.

Process flow 500 begins with wet chemical etching a work piece to remove a metal, see 505. As discussed, isotropic etching solutions, particularly peroxide based alkaline etchants, are well suited for this method, particularly when the metal is copper. Referring to FIG. 6, apparatus 600 includes a wet etch module, 605, in which the chemical etchant is applied, for example sprayed, onto a wafer to isotropically remove a portion of copper on the surface of a wafer. Exemplary etch modules are described in the U.S. patents and applications incorporated by reference above.

As described, some embodiments include peroxide decomposition. Referring to FIG. 6, used etchant flows from etch module 605, for example via gravity feed, to a peroxide decomposition tank, 610. The peroxide in a peroxide based alkaline etchant will eventually decompose naturally. However, it is desirable to incorporate a buffer tank in which the peroxide decomposition is facilitated. In one such embodiment, to avoid the above identified peroxide stability and treatment problem, a waste etch solution decomposition "buffer holding" tank is provided in the line, for example, integrated into the apparatus. Such a tank allows time for the peroxide in the used etchant to decompose before further processing is performed on the used etch solution to regenerate it. Stabilizing the etch stream obviates concern for subsequent peroxide reactions and related safety issues downstream. The decomposition tank or "etch stabilization" module 610 is appropriately configured to be sufficiently large so that the fluid residence time in the tank T is larger than the measured oxidizer breakdown time constant ($\tau$=F/V, where $\tau$ is the average fluids in the tank residence time in minutes, F is the time average waste etch flow rate in liters per minutes, and V is the breakdown tanks volume in liters), and generally is not so large as to be prohibitively expensive or occupy excess volume. The design and volume of the etch stabilization module should be sufficient so that the exiting solution from the etch stabilization module is less than 50% of the inlet oxidizer concentration. In some embodiments, the tank contains various means such as flow baffles and cascading barriers to modulate the flow streamlines, in order to avoid flow short cuts and aids in maximizing the time in which each new volume waste resides on average in the tank before exiting the container. Tank 610 contains, for example, cascading barriers. The peroxide breakdown is facilitated by the residence time (supra) and the physical act of cascading over the barriers. Tank 610 is vented due to the oxygen liberated during the decomposition.

As mentioned, hydrogen peroxide or other peroxide is broken down autocatalytically or aided by a catalyst, and in the case of hydrogen peroxide, oxygen gas bubbles are formed, rise, and are separated from the fluid. Examples of suitable catalyst include high surface area carbons such as activated carbon or carbon aerogel, or zeolite supported high surface area platinum or palladium. One additional useful attribute of the etch stabilization cell and the associated exothermic decomposition reactions is that the exotherm can be used as a heat source for further processing of the stabilized etch solution. The temperature of the solution increases during the decomposition process, as shown in FIG. 1 and indicated by equation (1) and (2). This temperature rise can be used to operate the etch process as a whole at a higher temperature, for example 40-50° C., which can greatly increase the metal removing etching rate and minimizes the size of the equipment and heating energy required in otherwise doing so. Put another way, the heat of the decomposition reaction can be used as a chemical energy source to accelerate the etch rate and associated wafer throughput, rather than simply throwing this energy away.

Such decomposition tanks may also have additional features that generally increase the streamline flow path distances. In other embodiments, the tank contains various means of mixing and recirculating the peroxide based etchant prior to exiting the tank so that the tanks composition is largely uniform. In some embodiments the tank includes one or more suitable oxidizer breakdown catalyst (e.g. activated carbon, noble metal dispersed on a high surface area catalyst), a fluid height sensor(s), a copper metal ion sensor (e.g. ion specific electrode or a spectrophotometer means of measurements, for example, measuring the adsorption of light at 600 nm) and means of measuring the fluid temperature in the tank. The metal ion sensor(s) in the system combined with the etch flow rate can be used to determine the current metal removal rate (etch rate) of the wafer. By a mass balance around the concentration of the incoming and outgoing copper content of the etch solution and the solution flow rate, the etch rate can be determined, and adjusted as desired to maintain a fixed etch rate, and/or to modify the etch rate over some predetermine or desired rate/time profile.

Referring again to FIG. 5, after the peroxide is substantially decomposed, excess metal is electrowinned from the etchant, see 510. Electrowinning is an efficient mode of handling and treating the stabilized etch waste solution (etch solution where the peroxide has decomposed). The etch solution copper concentration of typically around 1 gm/L (0.1%, 1000 ppm) is typically too high for cost effective ion exchange treatment alone. Treating the solution in this manner would require substantial dilution, very large capacity and/or numbers of ion exchange columns and/or frequent column regeneration. The ion exchange treatment is best suited for remove of metals at concentrations below about 200 ppm, or below about 100 ppm. Also, because the etch solution already contains complexing agents active in the pH range of approximately 7 to 11, ion exchange could require a costly pH adjustment to more acidic conditions first. If one has a fixed volume waste stream, it makes sense to first remove the bulk of the metal to ion-exchanged-suitable levels, so that the total amount of metal to be removed and the sizing of the ion exchange columns can be minimized. Electrowinning is particularly suited for moderate metals concentration because of its effectiveness and large metal-processing capacity (typically limited, for example, by the porosity of the metal cathode substrate). However, because the copper in the solution is highly complexed in the alkaline etch waste, it was unclear whether removal of the metal by electrowinning was feasible. Surprisingly the inventors have found that electrowinning the stabilized used etchant is not only feasible, but the copper is efficiently removed and the resulting etchant can be regenerated and reused, in one embodiment, in a recirculation format, for example as depicted in FIG. 6.

Figure 4:
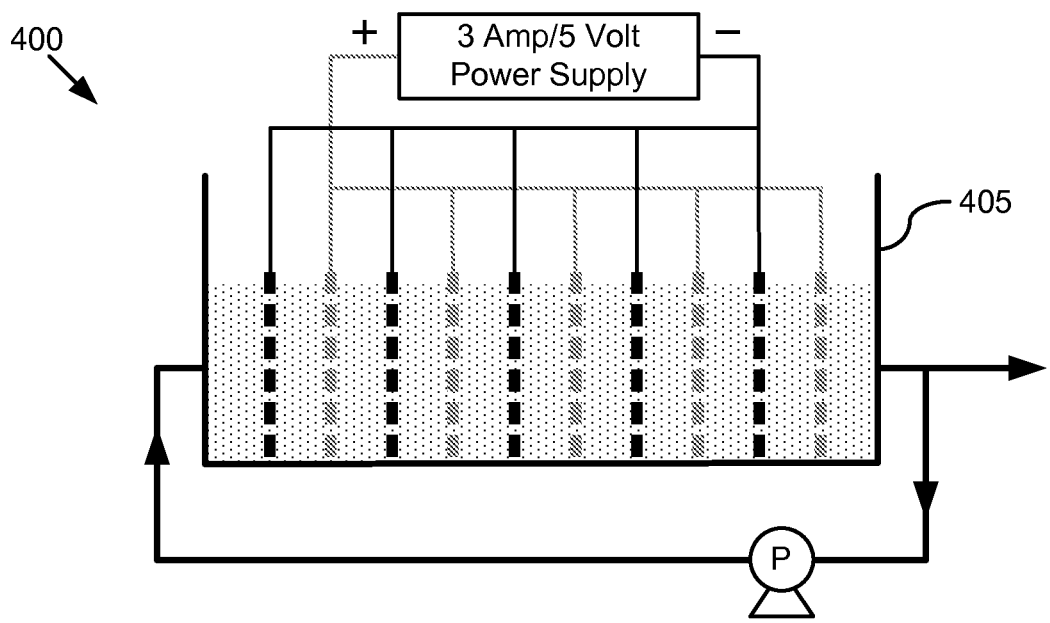
FIG. 4 shows the general layout of an electrowinning apparatus.
Figure 7:
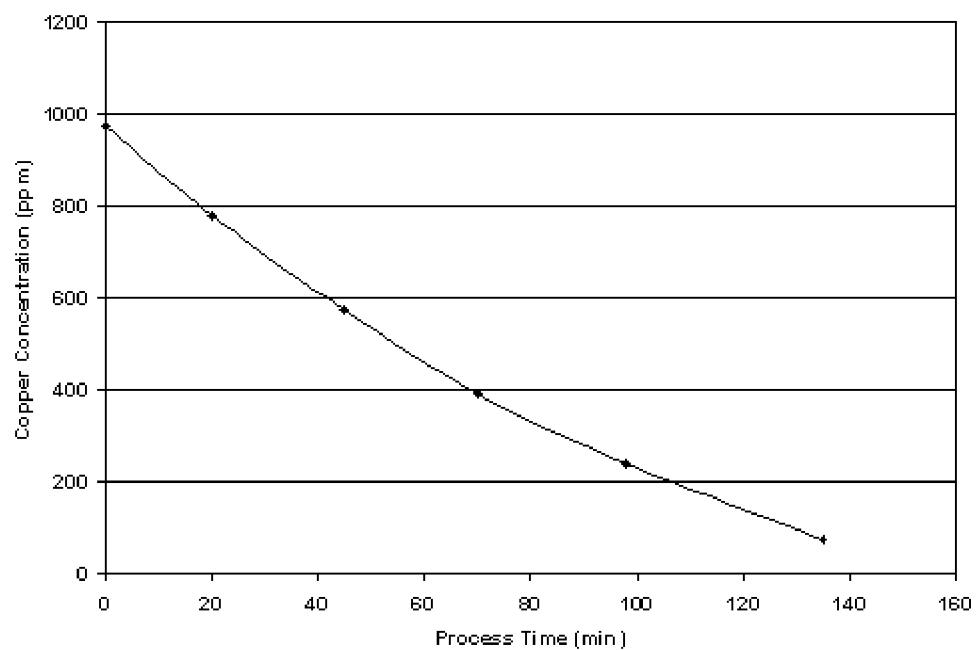
FIG. 7 shows the results of copper concentration in the etch solution vs. time using an experimental electrowinning apparatus.

In order to test the feasibility of electrowinning the stabilized etchant, an electrowinning test on a 950 ppm stabilized copper etch waste solution in a bench scale experimental apparatus was performed. FIG. 4 shows the general layout of an electrowinning apparatus, 400, and FIG. 7 shows the results of the copper concentration in the etch vs. time using the experimental apparatus. The concentration vs. time was determined by taking solution samples periodically and using a pre-calibrated spectrophotometric-600 nm-adsorption of the stabilized etch solution vs. copper concentration. Referring to FIG. 4, the test electrowinning apparatus included a tank, 405, in this example an 8 liter tank (which held about 5 liters of etchant in a flow through fashion), which had suspended in it alternating pairs of electrodes. A 3 Amp/5 volt power supply was used to charge the electrodes. The anodes were titanium screen coated with niobium. The cathodes were porous copper "foam" flow through electrodes. A pump, denoted with a "P," circulated the etchant through apparatus 400 until a desired copper concentration was reached.

Referring to FIG. 7, the results of the electrowinning test, while un-optimized (e.g., the number of electrodes used, current density applied, total current, flow rate, etc. weren't optimized), clearly show that removal of metal from the etch solution at the typical copper concentrations is rapid and can be performed efficiently (small volume, low power, high rate). Moreover, it has been discovered that the electrowinned etch solution contained essentially all the necessary components of the isotropic etch used to remove the copper, less the hydrogen peroxide oxidizer. It was also realized that, rather than simply disposing of this processed waste stream, it was highly suited for reuse.

The electrowinning process need not be 100% complete (i.e. the copper concentration of the solution exiting the electrowinning cell for storage and recycling need not be zero). Rather, at steady state, only the balance of the amount of metal added by the etching process must be removed. A low, but non-zero, copper concentration at the etch module inlet will increase by the amount of metal removed in the etch reactor, and that amount of metal on average removed in the electrowinning process. This is advantageous because removing metal from a more dilute solution (e.g., under about 100-200 ppm) is typically slower and hence would increase the size of the electrowinning equipment for the same fluid flow load. This tendency can be seen, for example, in the data of FIG. 7, where the rate of copper remove as indicated by the slope of the curve decreases below about 300 ppm.

Referring again to FIG. 6, the stabilized etchant flow enters electrowinning module, 615. Although apparatus 600 was described first in relation to the etching module 605, this was merely a convenient starting point. In practice, when operating apparatus 600, initially electrowinning cell 615 is charged with concentrated electrolytic etch precursor solution and water to create the desired concentrations of isotropic etch constituents (but not the etch oxidizer, typically hydrogen peroxide). Examples of suitable isotropic chemical formulations with concentration ranges and suitable isotropic etching apparatus can be found in the U.S. patents and patent applications incorporated by reference herein. The etching solution is optionally brought to a desired operating temperature by circulating the fluid in contact with a heat exchanger, collectively heat controller, 635. Heat controller 635 may also have a chiller function, as heat is built up in some of the processes during circulation of the etchant, for example breakdown of the peroxide produces heat which can be used to maintain a steady state recirculation of optimum conditions in the electrowinning module. In some embodiments, the electrowinning cell and one or more of the other components described hereafter are located on the tool and in close proximity to the isotropic wafer etch module. In other embodiments, these etch fluid treating cells are located remotely in the sub-fab and are connected to the tool though appropriate plumbing.

As mentioned, electrowinning cell 615 contains a plurality of porous flow-through cathodes and anodes, as known in the art. The cathode can be composed of foam metals (e.g. nickel, copper) or carbon (e.g. vitreous reticulated carbon), or other suitable conductive porous materials such as conductive screens or clothes that will allow copper to be electrodeposited thereupon. The anode can be made of metals such as lead, or, for example, a dimensionally stabilized anode (DSA) such as titanium, or coated titanium (e.g. niobium or platinum coated titanium). The stabilized etchant passes over and through the series of porous plates where the copper is plated and removed due to the application of a potential at the cathode below that of the reduction potential for the metal. Oxygen is the typical (but not necessarily only) generated product at the anode, in the form of bubbles, and some amount of hydroxide ion is typically formed in the process. Over time this may affect the pH of the solution, and some amount of pH adjusting modifier may be required to be added periodically as well as water and other constituents as denoted by one or more feed valves, 645. Bleed valve 640 allows portions of the circulating etchant to be removed, for example, after acid and/or salt builds up in the etchant flow and new reagents need to be added via the one or more feed valves, 645. The fluid may be recirculated, for example via one or more pumps P1, to allow for it to pass over the electrowinning electrodes a number of times and at high velocities (to improve convection). In preferred embodiments, the electrowinning cell has various in situ electrolyte monitoring equipment, collectively analyzer 630, (e.g. conductivity, optical adsorption, pH, density) in the recirculation line capable of measuring the concentrations of the solution constituents (water, copper, chelator concentration, neutralizing agents), and the measured values of these meters are used to determine the solution concentrations, which is in turn are used as part of a computer controlled feedback loop to add materials to the solution to maintain it at its target values. The analysis at the electrowinning module is important, but the addition of make up reagents need not be performed at the electrowinning module, for example, feed stocks can be added at, for example, a buffering tank, 620. Also, some of the electrowinned material is continuously or periodically bled from the system to remove and maintain the concentration of undesirable breakdown products that may be formed in the wafer etching, etch stabilization, or electrowinning process (or other sources of stray contaminants) from reaching a level that will impede the consistent performance and operation of etching process. The stabilized etchant is circulated through the electrowinning module until the desired level of copper is reached. Appropriate valves allow this circulation and/or diversion to the next module of apparatus 600.

Referring again to FIG. 6, the stabilized and electrowinned etchant, "etch precursor," is next passed to an optional etch precursor solution buffering tank, 620. This tank allows for a sufficient supply of low copper stabilized etch solution to be available at all times, for example, for a process which may demand material intermittently but in relatively large volumes, and helps control swings in the volumes of fluid stored in the system sub-cells and overall flow loop. One or more recirculation pumps, P2, are also included that can deliver the etch precursor to the oxidizer in-line mixing bowl and to the etching cell itself (e.g. for spraying the wafer with etchant). A three way valve, 655, is used for switching between recirculation mode and chemical delivery mode. In other cases (not shown) two individual values may be used, or only a single value is used which taps fluid off of the recirculating line to deliver etchant to the etch module. Suitable temperature control means may be integrated into the buffer tank and/or the recirculation loop, indicated has heat controller 650. Typically the buffer tank will have a capacity larger than the volumes of the combined etch cell, stabilizing cell, and electrowinning cell, and is large enough to hold all the fluid in the entire system. Like the stabilization and electrowinning cells, buffer tank 620 and associated apparatus may be integrated as part of the wafer processing tool, or located more remotely in the wafer processing fab.

Referring again to FIG. 5, process flow 500, the etch precursor is next regenerated, see 515. Etch precursor is regenerated by combining with, for example, a stream of, for example, about 30% hydrogen peroxide, using an in-line mixing fixture (not shown) and the etch becomes "activated" (capable of etching metal at the target specifications). Adding hydrogen peroxide oxidizer to the stabilized and electrowinning stream regenerates the peroxide-based etchant, and this process of decomposing the peroxide from the used etchant, electrowinning the stabilized etchant and regenerating the etchant by adding peroxide can be maintained, theoretically, indefinitely. In practice, some monitoring of the electrowinning process and solution recycle may be required, as well as intermittently disposing of some portion of the recycle stream and adding fresh constituents (i.e. bleed and feeding the system).

The amount of time between the point where the fluid is activated and is subsequently exposed to the wafer for etching should be carefully controlled, as the isotropic etch solution is inherently unstable, will begin to heat and release oxygen gas (excess amounts of either potentially leading to an unwieldy process). Typically the fluid residence time after mixing with oxidizer is kept small by using relatively small line length and diameter fluid lines and inline mixing fixture volumes. The residence time between mixing and use should generally be less than about 3 minutes, more preferably less than about 1 minute and most preferably less than about 15 seconds. Valve 625 indicates the entry point of the peroxide stream as in close proximity to the etch module 605, in order to reduce residence time.

The regenerated etchant is then exposed to (e.g. sprayed onto) the wafer and it etches the metal from the wafer surface, see 520. This completes process flow 500. Details of suitable processes and hardware for this operation have been described above and disclosed in more detail in patents and applications incorporated by reference herein. Multiple nozzles can be used to control the instantaneous etching profile, and when one or more nozzles are not active, an equivalent flow-resistance by-pass-line may be used to route the fluid directly to the etch stabilization cell.

Generally, at the concentrations typically employed for the isotropic etch disclosed in the references and examples cited above, and because the of the relatively small amount of copper removed compared to the concentration of the other constituents in the system (0.1% copper vs. typically 1-4% for the active components) the isotropic etch process is relatively insensitive to the small amount of copper in the regenerated (reconstituted and recycled) etch precursor stream. This attribute can eliminate, in some situations, the need for substantially constant or accurate copper removal rate and precursor copper concentration as the results are generally insensitive to the typical process fluctuations. The major impact on the process is on the decomposition rate of the activated solution and its temperature, and emphasizes the need to minimize the time between the time of fluid activation and utilization and control the etch temperature. Therefore, in some embodiments, suitable mechanisms for in-line control of the temperature of the activated etch are envisioned. After etching the wafer the etch fluid is collected at the etch module drain and directed to the etch stabilization module. The wafer is spun and rinsed at the end of the process. Various modes of minimizing the amount of rinse water that ends up, and potentially would dilute the etch recovery system are, for example, a rinse diverter valve, and/or a multiple high cell configuration with separate level or other diverters preventing the rinsate from diluting the etchant stream.

While apparatus 600 is shown as a continuously flowing system, one of ordinary skill in the art would appreciate that apparatus 600 is not limited in this way. For example, the stabilized waste from the peroxide decomposition tank can be stored in a buffering tank prior to being electrowinned, and the electrowinning need not be continuously operated. Similarly, the product of the electrowinning copper removal can be stored in a "buffering tank" as show in FIG. 6. The recovery system and recycle loop can have one or more modules integrated into a work piece processing tool such as a semiconductor manufacturing tool that processes wafers, or the recovery system can have one or more components off line of such a tool. For example, the electrowinning system can be performed on or off the tool. In some embodiments, the stabilization system is on the tool, and the electrowinning system is fed fluid from the stabilization system, but is located in a remote location within the same facility (along with an optional remotely located etch precursor buffer storage tank). In other embodiments, both the electrowinning system and the stabilization system are located and perform their functions on the tool and relatively close proximity to the etching modules. In still further embodiments, the etch solution is stabilized and then transported off site, where it has its metal removed by electrowinning, ion exchange, or other suitable process, and then returned to the facility to a recovered etch precursor storage tank that feeds the in-line mixing system.

The system which bleeds part of material in the flow loop as part of a bleed and feed operation generates an etch waste stream (not necessarily having to come from the location in the flow loop shown in FIG. 6). Such a waste stream can be combined with an existing rinse water waste stream, treated plating wastes, or any other waste stream, and routed to undergo subsequent treatment processes. Typically, if one combines a plating rinse stream and an electrowinned plating stream with the electrowinned etch streams, these streams would undergo further treatments, such as carbon filtration and ion exchange, before being discharged to municipal waste.

Numerous other modifications may be made to the foregoing system without departing from the basic teachings thereof. Although the present invention has been described in substantial detail with reference to one or more specific embodiments, those of ordinary skill in the art will recognize that certain changes may be made, all without departing from the scope of spirit of the invention as set forth in the specifications and in the appended claims.

What is claimed is:

1. An apparatus for processing a work piece, comprising:
   (a) a wet chemical etching chamber for removing copper from a surface of the work piece with a peroxide-based etchant, said wet chemical etching chamber in fluid communication with and upstream of an electrowinning module;
   (b) the electrowinning module for electrochemically removing ions of copper from the peroxide-based etchant after it exits the wet chemical etching chamber, wherein the electrowinning module comprises an electrowinning cell comprising an anode and a cathode; and
   (c) a regeneration system configured to reintroduce one or more reagents into the peroxide-based etchant after it exits the wet chemical etching chamber in order to regenerate the peroxide-based etchant and reintroduce it into the wet chemical etching chamber.

2. The apparatus of claim 1, further comprising a decomposition tank configured to allow substantial decomposition of a peroxide in the peroxide-based etchant after exiting the wet chemical etching chamber and before entering the electrowinning module.

3. The apparatus of claim 2, wherein the regeneration system comprises:
   a peroxide inlet for introducing the peroxide into the peroxide-based etchant after the peroxide-based etchant exits the electrowinning module, said peroxide inlet proximate to an etchant inlet of the wet chemical etching chamber; and
   one or more make-up feeds for adding at least one of water, a copper chelator and a pH adjuster to the peroxide-based etchant.

4. The apparatus of claim 3, further comprising a buffer tank configured to store a volume of the peroxide-based etchant after it exits the electrowinning module, said buffer tank configured upstream of the peroxide inlet.

5. The apparatus of claim 3, wherein the decomposition tank is configured to hold the peroxide-based etchant for sufficient time such that greater than about 50% of the peroxide in the peroxide-based etchant decomposes without applying heat or additional reagents to the peroxide-based etchant in the decomposition tank.

6. The apparatus of claim 3, wherein peroxide-based etchant comprises an amine copper chelator and the peroxide is hydrogen peroxide.

7. The apparatus of claim 3, wherein the work piece is a semiconductor wafer.

8. The apparatus of claim 7, wherein the electrowinning module is configured to remove copper ions from the peroxide-based etchant so that the peroxide-based etchant exiting the electrowinning module comprises less than about 200 ppm of copper ions.

9. The apparatus of claim 7, wherein the electrowinning module is configured to remove copper ions from the peroxide-based etchant so that the peroxide-based etchant exiting the electrowinning module comprises less than about 100 ppm of copper ions.

10. The apparatus of claim 3, configured to deliver regenerated peroxide-based etchant to the wet chemical etching chamber in less than about 3 minutes.

11. The apparatus of claim 3, further comprising a bleed valve for removing the peroxide-based etchant from the apparatus to compensate for said one or more make-up feeds adding said at least one of water, a copper chelator and a pH adjuster to the peroxide-based etchant.

12. The apparatus of claim 3, further comprising a buffer tank configured to store a volume of the peroxide-based etchant after it exits the decomposition tank, said buffer tank configured upstream of the electrowinning module.

13. The apparatus of claim 11, further comprising one or more analytical probes configured to measure the peroxide-based etchant in the electrowinning module for at least one of pH, salt concentration, peroxide concentration, copper ion concentration, ionic strength and chelator concentration.

14. The apparatus of claim 13, further comprising a controller comprising an associated logic, said controller configured to operate at least the bleed valve and said one or more make-up feeds in order to maintain a steady state in the composition of the peroxide-based etchant as it exits the electrowinning module using measurements obtained from the one or more analytical probes.

15. The apparatus of claim 1, wherein the electrowinning cell comprises a plurality of porous anodes and cathodes.

\* \* \* \* \*